(12) United States Patent
Lin et al.

(10) Patent No.: US 8,232,601 B1
(45) Date of Patent: Jul. 31, 2012

(54) TRANSIENT VOLTAGE SUPPRESSORS

(75) Inventors: Kun-Hsien Lin, Hsinchu (TW);
Che-Hao Chuang, Hsinchu (TW); Ryan Hsin-Chin Jiang, Taipei (TW)

(73) Assignee: Amazing Microelectronic Corp., Hsin-Chu (TW)

( * ) Notice: Subject to any disclaimer, the term of this patent is extended or adjusted under 35 U.S.C. 154(b) by 0 days.

(21) Appl. No.: 13/475,599

(22) Filed: May 18, 2012

Related U.S. Application Data

(62) Division of application No. 12/888,151, filed on Sep. 22, 2010.

(51) Int. Cl.
*H01L 23/62* (2006.01)
(52) U.S. Cl. .................. 257/355; 257/360; 257/E29.014
(58) Field of Classification Search .................. 257/173, 257/175, 355, 360, 367, 577, E29.014
See application file for complete search history.

(56) References Cited

U.S. PATENT DOCUMENTS

| | | | |
|---|---|---|---|
| 7,030,447 B2 | 4/2006 | Robb et al. | |
| 2012/0025350 A1* | 2/2012 | Lin et al. | 257/546 |

\* cited by examiner

*Primary Examiner* — Hoai V Pham
(74) *Attorney, Agent, or Firm* — Morris Manning & Martin LLP; Tim Tingkang Xia, Esq.

(57) ABSTRACT

The present invention relates a transient voltage suppressor (TVS) for directional ESD protection. The TVS includes: a conductivity type substrate; a first type lightly doped region, having a first type heavily doped region arranged therein; a second type lightly doped region, having a second type heavily doped region and a third type heavily doped region arranged therein; a third type lightly doped region, having a fourth type heavily doped region arranged therein; a plurality of closed isolation trenches, arranged on the conductivity type substrate, wherein at least one of the plurality of closed isolation trenches is neighbored one of the type lightly doped regions; and a first pin. Accordingly, the TVS of present invention may adaptively provide effective ESD protection under positive and negative ESD stresses, improve the efficiency of ESD protection within the limited layout area.

9 Claims, 7 Drawing Sheets

TRANSIENT VOLTAGE SUPPRESSORS

This application is a divisional application of, and claims benefit of U.S. patent application Ser. No. 12/888,151, filed Sep. 22, 2010, entitled "TRANSIENT VOLTAGE SUPPRESSORS," by Kun-Hsien Lin et al., which status is allowed, the disclosure of which is hereby incorporated herein in its entirety by reference.

TECHNICAL FIELD

The present disclosure relates to a transient voltage suppressor (TVS), and more particularly, to a transient voltage suppressor for electrostatic discharge (ESD) protection.

TECHNICAL BACKGROUND

As the IC device sizes have been shrunk to nanometer scale, the consumer electronics, like the laptop and mobile devices, have been designed to be much smaller than ever. Without suitable protection devices, the functions of these electronics could be reset or even damaged under ESD events. Currently, all consumer electronics are expected to pass the ESD test requirement of IEC 61000-4-2 standard. TVS is generally designed to bypass the ESD energy, so that the electronic systems can be prevented from ESD damages. The working principle of TVS is shown in FIG. 1. In FIG. 1, the TVS devices 10 are connected in parallel with the protected circuits 12 on the PCB (Printed Circuit Board). These TVS devices 10 would be triggered immediately when the ESD event is occurred. In that way, each TVS device 10 can provide a superiorly low resistance path for discharging the transient ESD current, so that the energy of the ESD transient current can be bypassed by the TVS devices.

FIG. 2A is a schematic diagram showing a conventional uni-directional TVS, which includes a pair of diodes (D1 and D2), a zener diode, a first pin connected with port I/O 1 and a second pin connected to ground. Specifically, the pair of diodes are connected in serial, and the zener diode is connected with the pair of diodes in parallel, and the first pin connected with port I/O 1 is connected to the pair of diodes. FIG. 2B is a schematic diagram showing a conventional bi-directional TVS, which includes a first pair of diodes (D1 and D2), a second pair of diodes (D3 and D4), a zener diode, a first pin connected with port I/O 1 and a third pin connected with port I/O 2. Specifically, the first and second pair of diodes are respectively connected in serial, the zener diode is connected with the first and second pair of diodes in parallel, and first and second pins are respectively connected the first and second pair of diodes. With the portable and mobile devices being striven towards miniaturization continuously, the PCB space for placing the conventional uni-directional/bi-directional TVS devices becomes much smaller. Therefore, it is an important purpose to decrease the chip area of the conventional TVS and maintain effectively ESD protection at present.

For the reason that the traditional TVS could not provide effective ESD protection, a need has arisen to propose a novel scheme that may adaptively provide effectively ESD protection and overcome the drawbacks of the prior art.

TECHNICAL SUMMARY

In view of the foregoing, it is an object of the present invention to provide a transient voltage suppressor for ESD protection that may adaptively provide effective ESD protection under positive and negative ESD stresses, improve the efficiency of ESD protection within the limited layout area.

In an exemplary embodiment, the present disclosure provides a transient voltage suppressor for directional ESD protection, comprising:

a conductivity type substrate having highly doping concentration;

a first type lightly doped region, having a first type heavily doped region arranged therein, wherein the first type lightly doped region and the conductivity type substrate respectively belong to opposite types, and wherein the first type heavily doped region and the first type lightly doped region belong to same types;

a second type lightly doped region, having a second type heavily doped region and a third type heavily doped region arranged therein, wherein the second type lightly doped region and the conductivity type substrate respectively belong to opposite types, and wherein the second type heavily doped region and the third type heavily doped region respectively belong to opposite types, and the second type heavily doped region and the conductivity type substrate belong to same types, and wherein the second type heavily doped region is connected with the first type heavily doped region, and wherein a first transistor is formed by the second type heavily doped region, the second type lightly doped region and the conductivity type substrate;

a third type lightly doped region, having a fourth type heavily doped region arranged therein, wherein the third type lightly doped region and the conductively type substrate belong to same types, and wherein the third type lightly doped region and the fourth type heavily doped region respectively belong to opposite types, and wherein the fourth type heavily doped region is connected with the third type heavily doped region;

a plurality of closed isolation trenches, arranged on the conductivity type substrate, wherein at least one of the plurality of closed isolation trenches is neighbored one of the type lightly doped regions; and a first pin, connected with the first type heavily doped region and the second type heavily doped region.

In another exemplary embodiment, the present disclosure provides a transient voltage suppressor for directional ESD protection, comprising:

a conductivity type substrate having highly doping concentration;

a first type lightly doped region, having a first type heavily doped region arranged therein, wherein the first type lightly doped region and the conductivity type substrate respectively belong to opposite types, and wherein the first type heavily doped region and the first type lightly doped region belong to same types;

a second type lightly doped region, having a second type heavily doped region and a third type heavily doped region arranged therein, wherein the second type lightly doped region and the conductivity type substrate respectively belong to opposite types, and wherein the second type heavily doped region and the third type heavily doped region respectively belong to opposite types, and the second type heavily doped region and the conductivity type substrate belong to same types, and wherein the second type heavily doped region is connected with the first type heavily doped region, and wherein a first transistor is formed by the second type heavily doped region, the second type lightly doped region and the conductivity type substrate;

a third type lightly doped region, having a fourth type heavily doped region and a fifth type heavily doped region arranged therein, wherein the third type lightly doped region and the conductivity type substrate respectively belong to opposite types, and wherein the fourth type heavily doped region and the fifth type heavily doped region respectively belong to opposite types, and the fourth type heavily doped region and the conductivity type substrate belong to same types, and wherein the fourth type heavily doped region is connected with the third type heavily doped region;

a fourth type lightly doped region, having a sixth type heavily doped region arranged therein, wherein the fourth type lightly doped region and the conductivity type substrate belong to same types; and wherein the fourth type lightly doped region and the sixth type heavily doped region respectively belong to opposite types, and wherein the sixth type heavily doped region is connected with the fifth type heavily doped region;

a plurality of closed isolation trenches, arranged on the conductivity type substrate, wherein at least one of the plurality of closed isolation trenches is neighbored one of the type lightly doped regions; and a first pin, connected with the first type heavily doped region and the second type heavily doped region.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For your esteemed members of reviewing committee to further understand and recognize the fulfilled functions and structural characteristics of the disclosure, several exemplary embodiments cooperating with detailed description are presented as the follows.

Figure 1:
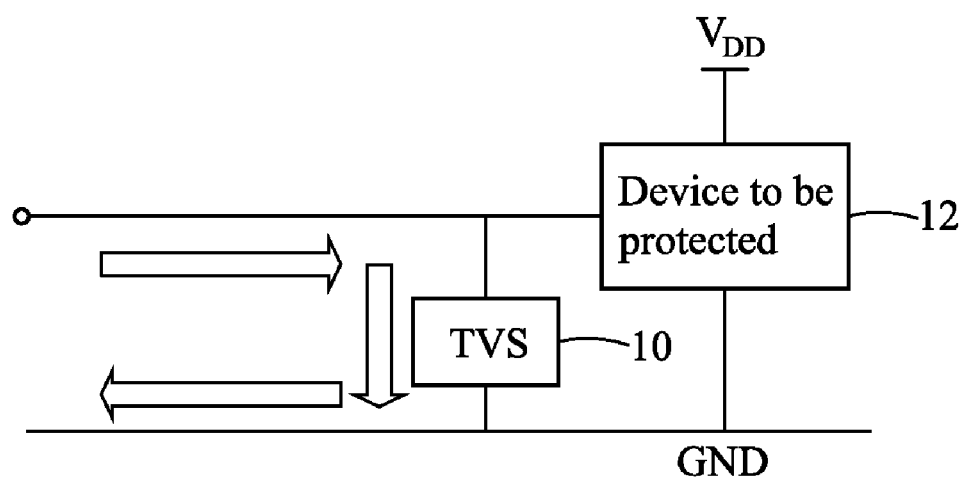
FIG. 1 is a schematic diagram showing a traditional transient voltage suppressor connected with a protected circuit.
Figure 2A:
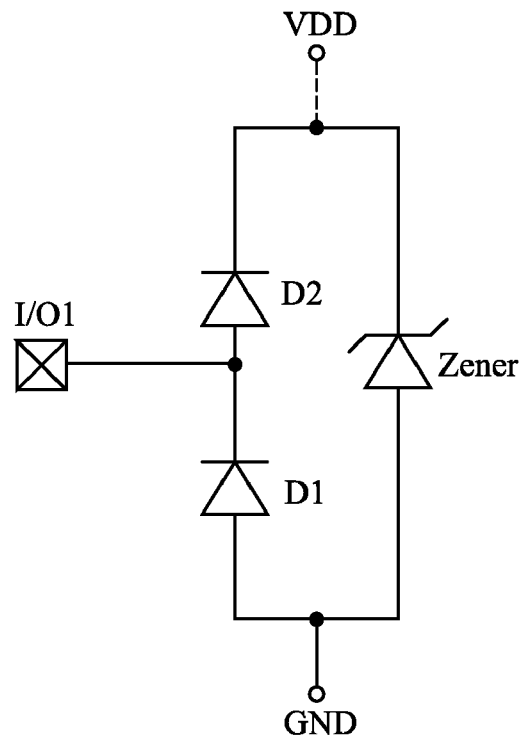
FIG. 2A is a schematic diagram showing a conventional uni-directional TVS.
Figure 2B:
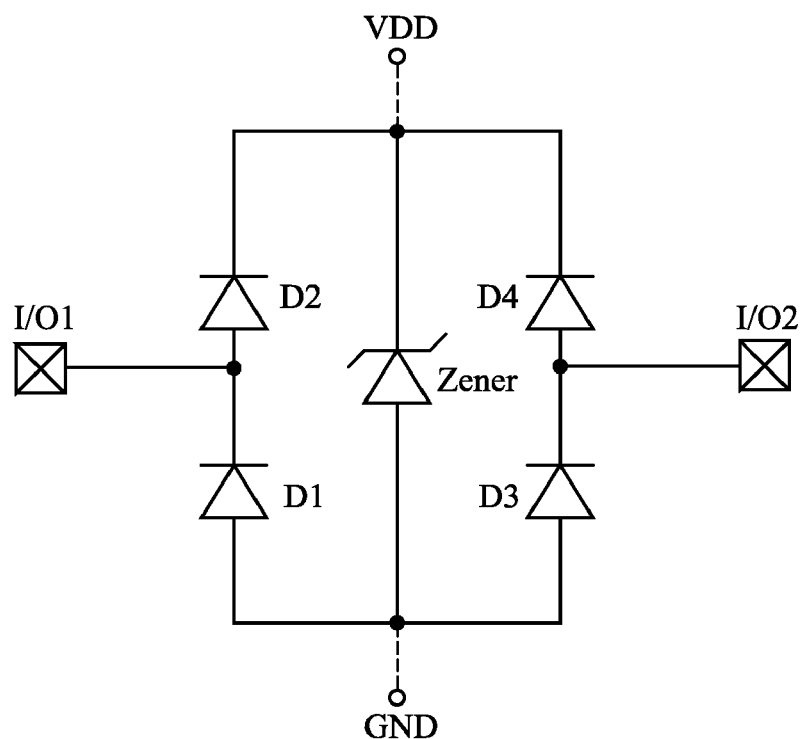
FIG. 2B is a schematic diagram showing a conventional bi-directional TVS.
Figure 3A:
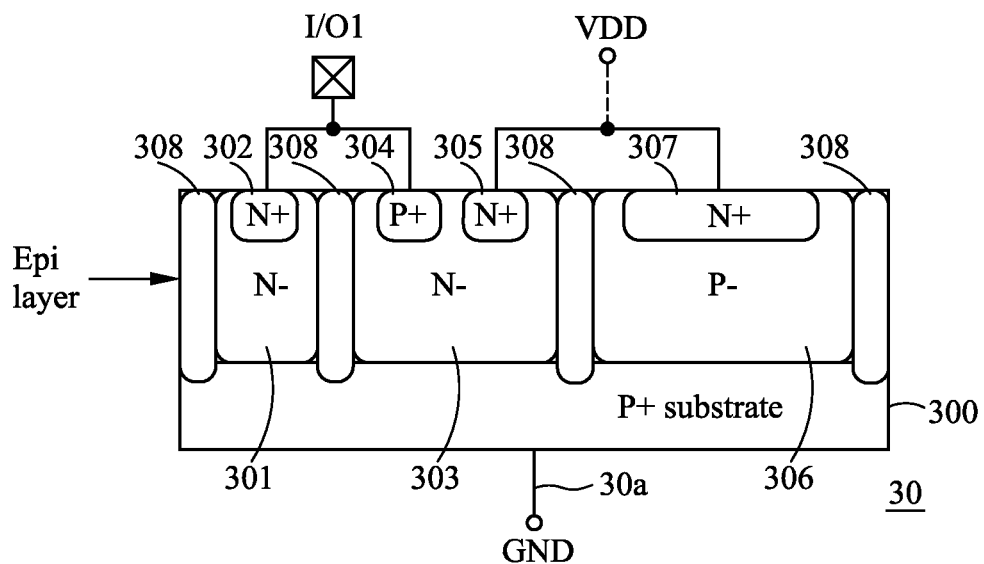
FIG. 3A is a cross-sectional view showing a uni-directional TVS 30 for ESD protection according to one embodiment of the present invention.

FIG. 3A is a cross-sectional view showing a uni-directional TVS 30 for ESD protection according to one embodiment of the present invention. The TVS 30 includes a conductivity type substrate 300 having highly doping concentration; a first type lightly doped region 301, having a first type heavily doped region 302 arranged therein, wherein the first type lightly doped region 301 and the conductivity type substrate 300 respectively belong to opposite types, and wherein the first type heavily doped region 302 and the first type lightly doped region 301 belong to same types; a second type lightly doped region 303 having a second type heavily doped region 304 and a third type heavily doped region 305 arranged therein, wherein the second type lightly doped region 303 and the conductivity type substrate 300 respectively belong to opposite types, and wherein the second type heavily doped region 304 and the third type heavily doped region 305 respectively belong to opposite types, and the second type heavily doped region 304 and the conductivity type substrate 300 belong to same types, and wherein the second type heavily doped region 304 is connected with the first type heavily doped region 302, and wherein a first transistor Q1 is formed by the second type heavily doped region 304, the second type lightly doped region 303 and the conductivity type substrate 300; a third type lightly doped region 306, having a fourth type heavily doped region 307 arranged therein, wherein the third type lightly doped region 306 and the conductively type substrate 300 belong to same types, and wherein the third type lightly doped region 306 and the fourth type heavily doped region 307 respectively belong to opposite types, and wherein the fourth type heavily doped region 307 is connected with the third type heavily doped region 305; a plurality of closed isolation trenches 308, arranged in the conductivity type substrate 300, wherein at least one of the plurality of closed isolation trenches is neighbored one of the type lightly doped regions; and a first pin connected with the first type heavily doped region 302 and the second type heavily doped region 304. Specifically, the TVS 30 further includes a second pin 30a is connected with the conductivity type substrate 300 for forming a uni-directional TVS 30. Additionally, the first type lightly doped region 301, the second type lightly doped region 303, the third type lightly doped region 306 and the plurality of closed isolation trenches 308 are arranged in the Epi layer on the conductivity type substrate 300.

Figure 3B:
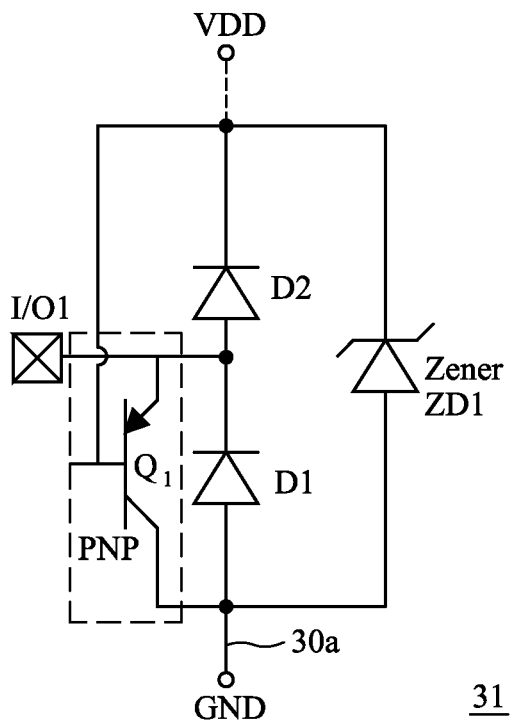
FIG. 3B is a schematic diagram showing an equivalent circuit 31 of FIG. 3A.

FIG. 3B is a schematic diagram showing an equivalent circuit 31 of FIG. 3A. The equivalent circuit 31 includes a first pair of diodes (D1 and D2) connected in serial connection, a zener diode ZD1 connected with the first pair of diodes in parallel connection and a first pin connected to the first pair of diodes. The first diode D1 is formed by the first type heavily doped region 302, the first type lightly doped region 301 and the conductivity type substrate 300. The second diode D2 is formed by the second type heavily doped region 304, the second type lightly doped region 303 and the third type heavily doped region 305. The zener diode ZD1 is formed by the fourth type heavily doped region 307, the third type lightly doped region 306 and the conductivity type substrate 300.

In the embodiment, the conductivity P type substrate 300 has highly doping concentration. The first N type lightly doped region 301 has the first N type heavily doped region 302 arranged therein. The second N type lightly doped region 303 has the second P type heavily doped region 304 and a third N type heavily doped region 305 arranged therein and the first PNP BJT Q1 is formed by the second P type heavily doped region 304, the second N type lightly doped region 303 and the conductivity P type substrate 300. The third P type lightly doped region 306 has the fourth N type heavily doped region 307 arranged therein. The plurality of closed isolation trenches 308 are arranged on the conductivity P type substrate 300. The first pin is connected with the first N type heavily doped region 302 and the second P type heavily doped region 304, and a second pin 30a is connected with the conductivity P type substrate 300. In the embodiment, two ESD discharging paths are generated when the first pin connected with port I/O 1 is under positive ESD stress and the second pin 30a is connected to the ground. One path is discharged through the lateral diode (D2) to zener diode (ZD1), and then discharged to the ground (the second pin 30a). Another path is discharged through the parasitic PNP BJT (Q1), and then discharged to the ground (the second pin 30a). By adding extra ESD discharging path (for example, the discharging path through the parasitic PNP BJT), the ESD protection efficiency of TVS can be improved within the limited layout area. In addition, one ESD discharging path is generated when the first pin connected with port I/O 1 is under negative ESD stress and the second pin 30a is connected to the ground. The path is discharged through the vertical diode (D1) to the first pin connected port I/O 1.

According to another embodiment, the conductivity N type substrate 300 has highly doping concentration. The first P type lightly doped region 301 has the first P type heavily doped region 302 arranged therein. The second P type lightly doped region 303 has the second N type heavily doped region 304 and a third P type heavily doped region 305 arranged therein and the first NPN BJT Q1 is formed by the second N type heavily doped region 304, the second P type lightly doped region 303 and the conductivity N type substrate 300. The third N type lightly doped region 306 has the fourth P type heavily doped region 307 arranged therein. The plurality of closed isolation trenches 308 are arranged on the conductivity N type substrate 300. The first pin is connected with the first P type heavily doped region 302 and the second N type heavily doped region 304, and the second pin 30a is connected with the conductivity N type substrate 300. Similarly, two ESD discharging paths are also generated in the embodiment when the second pin 30a connected with port I/O 1 is under positive ESD stress and first pin is connected to the ground. By adding extra ESD discharging path (for example, the discharging path through the parasitic NPN BJT), the ESD protection efficiency of TVS can be improved within the limited layout area.

Figure 3C:
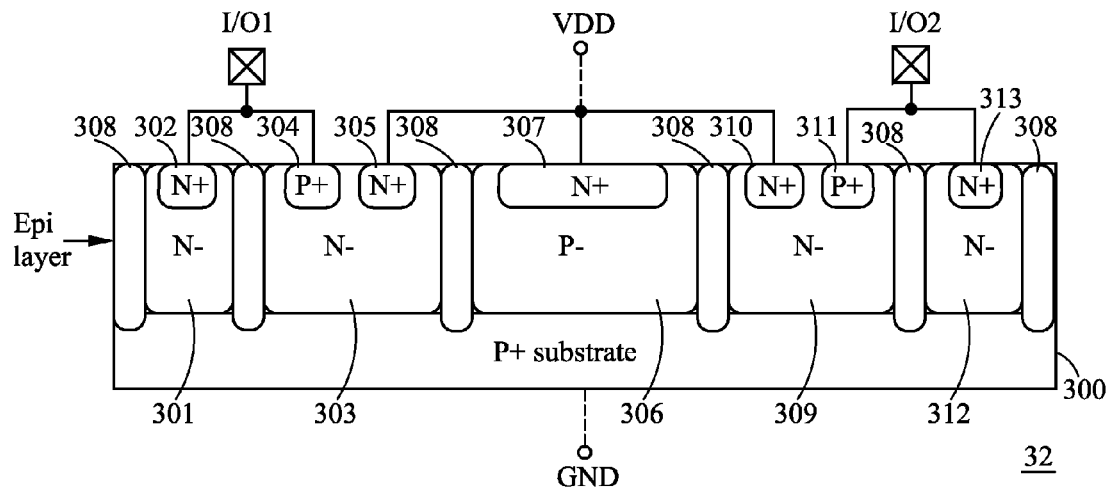
FIG. 3C is a cross-sectional view showing a bi-directional TVS 32 for ESD protection according to one embodiment of the present invention.

FIG. 3C is a cross-sectional view showing a TVS 32 for bi-directional ESD protection according to one embodiment of the present invention. The TVS 32 includes a conductivity type substrate 300 having highly doping concentration; a first type lightly doped region 301 having a first type heavily doped region 302 arranged therein, wherein the first type lightly doped region 301 and the conductivity type substrate 300 respectively belong to opposite types, and wherein the first type heavily doped region 302 and the first type lightly doped region 301 belong to same types; a second type lightly doped region 303 having a second type heavily doped region 304 and a third type heavily doped region 305 arranged therein, wherein the second type lightly doped region 303 and the conductivity type substrate 300 respectively belong to opposite types, and wherein the second type heavily doped region 304 and the third type heavily doped region 305 respectively belong to opposite types, and the second type heavily doped region 304 and the conductivity type substrate 300 belong to same types, and wherein the second type heavily doped region 304 is connected with the first type heavily doped region 302, and wherein a first transistor Q1 is formed by the second type heavily doped region 304, the second type lightly doped region 303 and the conductivity type substrate 300; a third type lightly doped region 306, having a fourth type heavily doped region 307 arranged therein, wherein the third type lightly doped region 306 and the conductively type substrate 300 belong to same types, and wherein the third type lightly doped region 306 and the fourth type heavily doped region 307 respectively belong to opposite types, and wherein the fourth type heavily doped region 307 is connected with the third type heavily doped region 305; a fourth type lightly doped region 309, having a fifth type heavily doped region 310 and a sixth type heavily doped region 311 arranged therein, wherein the fourth type lightly doped region 309 and the conductively type substrate 300 belong to opposite types, and wherein the fifth type heavily doped region 310 and the sixth type heavily doped region 311 respectively belong to opposite types, and the sixth type heavily doped region 311 and the conductivity type substrate 300 belong to same types, and wherein the fifth type heavily doped region 310 is connected with the fourth type heavily doped region 307; and wherein a second transistor Q2 is formed by the sixth type heavily doped region 311, the fourth type lightly doped region 309, and the conductivity type substrate 300; a fifth type lightly doped region 312, having a seventh type heavily doped region 313 arrange therein, wherein the fifth type lightly doped region 312 and the conductivity type substrate 300 respectively belong to opposite types, and wherein the seventh type heavily doped region 313 and the fifth type lightly doped region 312 belong to same types, and wherein the seventh type heavily doped region 313 is connected with the sixth type heavily doped region 311; a plurality of closed isolation trenches 308, arranged in the conductivity type substrate 300, wherein at least one of the plurality of closed isolation trenches is neighbored one of the type lightly doped regions; a first pin connected with the first type heavily doped region 302 and the second type heavily doped region 304; and a third pin connected with the seventh type heavily doped region 313 and the sixth type heavily doped region 311. Additionally, the first type lightly doped region 301, the second type lightly doped region 303, the third type lightly doped region 306, the fourth type lightly doped region 309, the fifth type lightly doped region 312 and the plurality of closed isolation trenches 308 are arranged in the Epi layer on the conductivity type substrate 300.

Figure 3D:
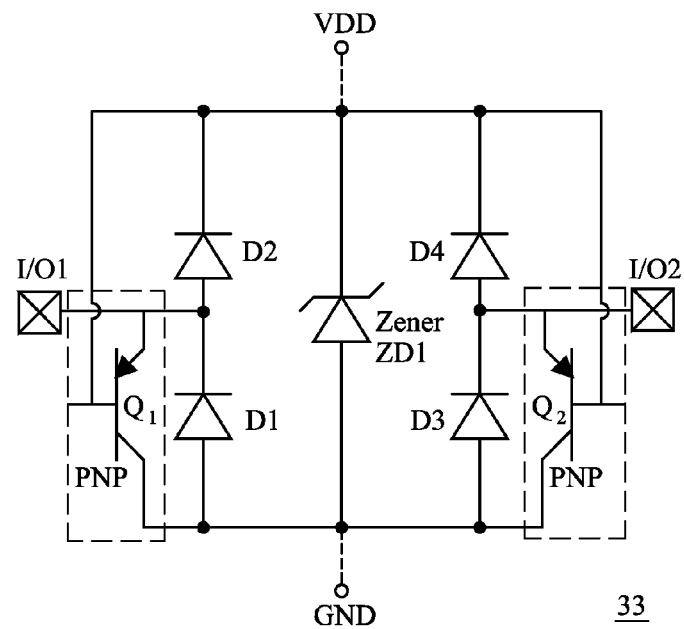
FIG. 3D is a schematic diagram showing an equivalent circuit 33 of FIG. 3C.

FIG. 3D is a schematic diagram showing an equivalent circuit 33 of FIG. 3C. The equivalent circuit 33 includes a first pair of diodes (D1 and D2) connected in serial connection, a second pair of diodes (D3 and D4) connected in serial connection, a zener diode ZD1 connected with the pair of diodes in parallel connection, a first pin connected with port I/O 1 and a third pin connected with port I/O 2 respectively connected to the first and second pair of diodes. A first diode D1 is formed by the first type heavily doped region 302, the first type lightly doped region 301 and the conductivity P type substrate 300. A second diode D2 is formed by the second type heavily doped region 304, the second type lightly doped region 303 and the third type heavily doped region 305. A third diode D3 is formed by the seventh type heavily doped region 313, the fifth type lightly doped region 312 and the conductivity type substrate 300. A fourth diode D4 is formed by the sixth type heavily doped region 311, the fourth type lightly doped region 309 and the fifth type heavily doped region 310. The zener diode ZD1 is formed by the fourth type heavily doped region 307, the third type lightly doped region 306 and the conductivity type substrate 300.

In the embodiment, the conductivity P type substrate 300 has highly doping concentration. The first N type lightly doped region 301 has the first N type heavily doped region 302 arranged therein. The second N type lightly doped region 303 has the second P type heavily doped region 304 and a third N type heavily doped region 305 arranged therein and the first PNP BJT Q1 is formed by the second P type heavily doped region 304, the second N type lightly doped region 303 and the conductivity P type substrate 300. The third P type lightly doped region 306 has the fourth N type heavily doped region 307 arranged therein. The fourth N type lightly doped region 309 has the fifth N type heavily doped region 310 and the sixth P type heavily doped region 311 arranged therein and the second PNP BJT Q2 is formed by the sixth P type heavily doped region 311, the fourth N type lightly doped region 309, and the conductivity P type substrate 300. The fifth N type lightly doped region 312 has the seventh N type heavily doped region 313 arrange therein. The plurality of closed isolation trenches 308 are arranged on the conductivity P type substrate 300. The first pin is connected with the first N type heavily doped region 302 and the second P type heavily doped region 304 and the third pin is connected with the seventh N type heavily doped region 313 and the sixth P type heavily doped region 311. In the embodiment, two ESD discharging paths are generated when the first pin connected with port I/O 1 is under positive ESD stress and the third pin connected with port I/O 2 is connected to the ground. One path is discharged through the lateral diode (D2) to the zener diode (ZD1), and then discharged through the vertical diode (D3) to the ground (I/O 2). Another path is discharged through the parasitic PNP BJT (Q1), and then discharged through the vertical diode (D3) to the ground (I/O 2). Similarly, two ESD discharging paths are also generated when the first pin connected with port I/O 1 is under negative ESD stress and the third pin connected with port I/O 2 is connected to the ground. Thereby, by adding extra ESD discharging path (for example, the discharging path through the parasitic PNP BJT), the ESD protection efficiency of TVS can be improved within the limited layout area.

According to another embodiment, the conductivity N type substrate 300 has highly doping concentration. The first P type lightly doped region 301 has the first P type heavily doped region 302 arranged therein. The second P type lightly doped region 303 has the second N type heavily doped region 304 and a third P type heavily doped region 305 arranged therein and the first NPN BJT Q1 is formed by the second N type heavily doped region 304, the second P type lightly doped region 303 and the conductivity N type substrate 300. The third N type lightly doped region 306 has the fourth P type heavily doped region 307 arranged therein. The fourth P type lightly doped region 309 has the fifth P type heavily doped region 310 and the sixth N type heavily doped region 311 arranged therein and the second NPN BJT Q2 is formed by the sixth N type heavily doped region 311, the fourth P type lightly doped region 309, and the conductivity N type substrate 300. The fifth P type lightly doped region 312 has the seventh P type heavily doped region 313 arrange therein. The plurality of closed isolation trenches 308 are arranged on the conductivity N type substrate 300. The first pin connected with port I/O 1 is connected with the first P type heavily doped region 302 and the second N type heavily doped region 304 and the third pin connected with port I/O 2 is connected with the seventh P type heavily doped region 313 and the sixth N type heavily doped region 311. In the embodiment, two ESD discharging paths are generated when the first pin connected with port I/O 1 is under positive ESD stress and the third pin connected with port I/O 2 is connected to the ground. Similarly, two ESD discharging paths are also generated when the first pin connected with port I/O 1 is under negative ESD stress and the third pin connected with port I/O 2 is connected to the ground. Thereby, by adding extra ESD discharging path (for example, the discharging path through the parasitic NPN BJT), the ESD protection efficiency of TVS can be improved within the limited layout area.

Figure 4A:
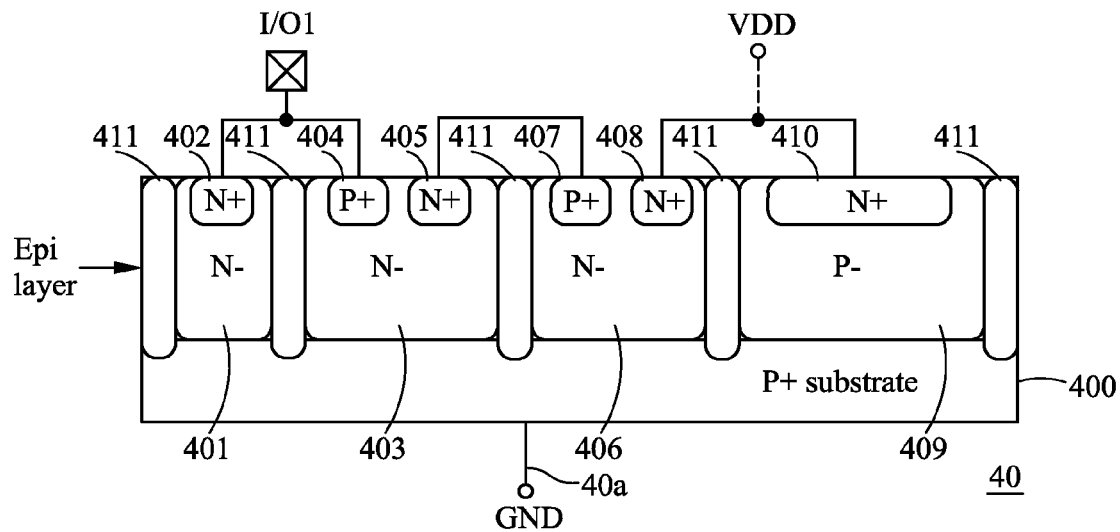
FIG. 4A is a cross-sectional view showing a uni-directional TVS 40 for ESD protection according to one embodiment of the present invention.

FIG. 4A is a cross-sectional view showing a TVS 40 for uni-directional ESD protection according to one embodiment of the present invention. The TVS 40 includes: a conductivity type substrate 400 having highly doping concentration; a first type lightly doped region 401, having a first type heavily doped region 402 arranged therein, wherein the first type lightly doped region 401 and the conductivity type substrate 400 respectively belong to opposite types, and wherein the first type heavily doped region 402 and the first type lightly doped region 401 belong to same types; a second type lightly doped region 403, having a second type heavily doped region 404 and a third type heavily doped region 405 arranged therein, wherein the second type lightly doped region 403 and the conductivity type substrate 400 respectively belong to opposite types, and wherein the second type heavily doped region 404 and the third type heavily doped region 405 respectively belong to opposite types, and the second type heavily doped region 404 and the conductivity type substrate 400 belong to same types, and wherein the second type heavily doped region 404 is connected with the first type heavily doped region 402, and wherein a first transistor Q1 is formed by the second type heavily doped region 404, the second type lightly doped region 403 and the conductivity type substrate 400; a third type lightly doped region 406, having a fourth type heavily doped region 407 and a fifth type heavily doped region 408 arranged therein, wherein the third type lightly doped region 406 and the conductivity type substrate 400 respectively belong to opposite types, and wherein the fourth type heavily doped region 407 and the fifth type heavily doped region 408 respectively belong to opposite types, and the fourth type heavily doped region 407 and the conductivity type substrate 400 belong to same types, and wherein the fourth type heavily doped region 407 is connected with the third type heavily doped region 405; a fourth type lightly doped region 409, having a sixth type heavily doped region 410 arranged therein, wherein the fourth type lightly doped region 409 and the conductivity type substrate 400 belong to same types; and wherein the fourth type lightly doped region 409 and the sixth type heavily doped region 410 respectively belong to opposite types, and wherein the sixth type heavily doped region 410 is connected with the fifth type heavily doped region 408; a plurality of closed isolation trenches 411, arranged on the conductivity type substrate 400, wherein at least one of the plurality of closed isolation trenches is neighbored one of the type lightly doped regions; and a first pin, connected with the first type heavily doped region 402 and the second type heavily doped region 404. Specifically, the TVS 40 further includes a second pin 40a is connected with the conductivity type substrate 400 for forming a uni-directional TVS 40. Additionally, the first type lightly doped region 401, the second type lightly doped region 403, the third type lightly doped region 406, the fourth type lightly doped region 409 and the plurality of closed isolation trenches 411 are arranged in the Epi layer on the conductivity type substrate 400.

Figure 4B:
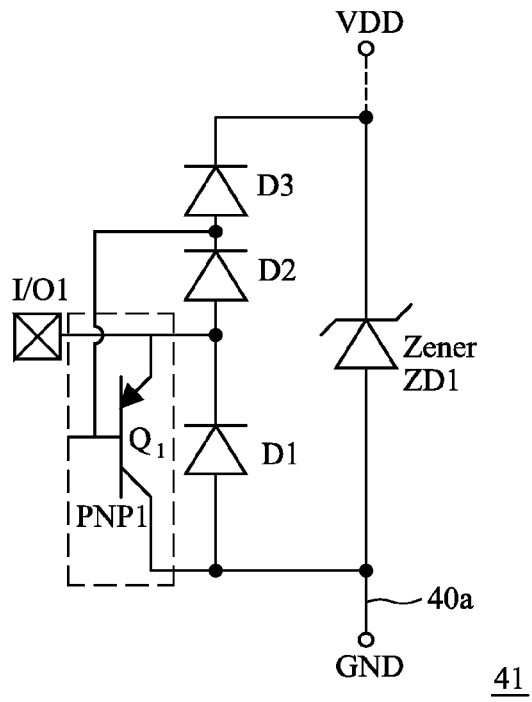
FIG. 4B is a schematic diagram showing an equivalent circuit 41 of FIG. 4A.

FIG. 4B is a schematic diagram showing an equivalent circuit 41 of FIG. 4A. The equivalent circuit 41 includes a first group of three diodes (D1, D2, D3) connected in serial connection, a zener diode ZD1 connected with the group of three diodes in parallel connection and a first pin connected to the first group of diodes. A first diode D1 is formed by the first type heavily doped region 402, the first type lightly doped region 401 and the conductivity type substrate 400, and a second diode D2 is formed by the second type heavily doped region 404, the second type lightly doped region 403 and the third type heavily doped region 405, and a third diode D3 is formed by the fourth type heavily doped region 407, the third type lightly doped region 406 and the fifth type heavily doped region 408, and a zener diode ZD1 is formed by the sixth type heavily doped region 410, the fourth type lightly doped region 409 and the conductivity type substrate 400. In the present invention, the third diode (D3) is connected to the second diode (D2) in series in order to reduce the input capacitance of TVS.

In the embodiment, the conductivity P type substrate 400 has highly doping concentration. The first N type lightly doped region 401 has the first N type heavily doped region 402 arranged therein. The second N type lightly doped region 403 has the second P type heavily doped region 404 and the third N type heavily doped region 405 arranged therein and the first PNP BJT Q1 is formed by the second P type heavily doped region 404, the second N type lightly doped region 403 and the conductivity P type substrate 400. The third N type lightly doped region 406 has the fourth P type heavily doped region 407 and the fifth N type heavily doped region 408 arranged therein. The fourth P type lightly doped region 409 has the sixth N type heavily doped region 410 arranged therein. The plurality of closed isolation trenches 411 are arranged on the conductivity N type substrate 400. The first pin is connected with the first N type heavily doped region 402 and the second P type heavily doped region 404 and the second pin 40a is connected with the conductivity P type substrate 400. In the embodiment, two ESD discharging paths are generated when the first pin connected with port I/O 1 is under positive ESD stress and the second pin 40a is connected to the ground. One path is discharged through the lateral diodes (D2 and D3) to zener diode (ZD1), and then discharged to the ground (the second pin 40a). Another path is discharged through the parasitic PNP BJT (Q1), and then discharged to the ground (the second pin 40a). By adding extra path of ESD current discharged (for example, the discharging path through the parasitic PNP BJT), the ESD protection efficiency of TVS can be improved within the limited layout area. In addition, one ESD discharging path is generated when the first pin connected with port I/O 1 is under negative ESD stress and the second pin 40a is connected to the ground. The path is discharged through the vertical diode (D1) to the first pin connected with port I/O 1.

According to another embodiment, the conductivity N type substrate 400 has highly doping concentration. The first P type lightly doped region 401 has the first P type heavily doped region 402 arranged therein. The second P type lightly doped region 403 has the second N type heavily doped region 404 and the third P type heavily doped region 405 arranged therein and the first NPN BJT Q1 is formed by the second N type heavily doped region 404, the second P type lightly doped region 403 and the conductivity N type substrate 400. The third P type lightly doped region 406 has the fourth N type heavily doped region 407 and the fifth P type heavily doped region 408 arranged therein. The fourth N type lightly doped region 409 has the sixth P type heavily doped region 410 arranged therein. The plurality of closed isolation trenches 411 are arranged on the conductivity P type substrate 400. The first pin is connected with the first P type heavily doped region 402 and the second N type heavily doped region 404 and the second pin 40a is connected with the conductivity N type substrate 400. In the embodiment, two ESD discharging paths are generated when the second pin 40a connected port I/O 1 is under positive ESD stress and the first pin is connected to the ground. By adding extra ESD discharging path (for example, the discharging path through the parasitic NPN BJT), the ESD protection efficiency of TVS can be improved within the limited layout area.

Figure 4C:
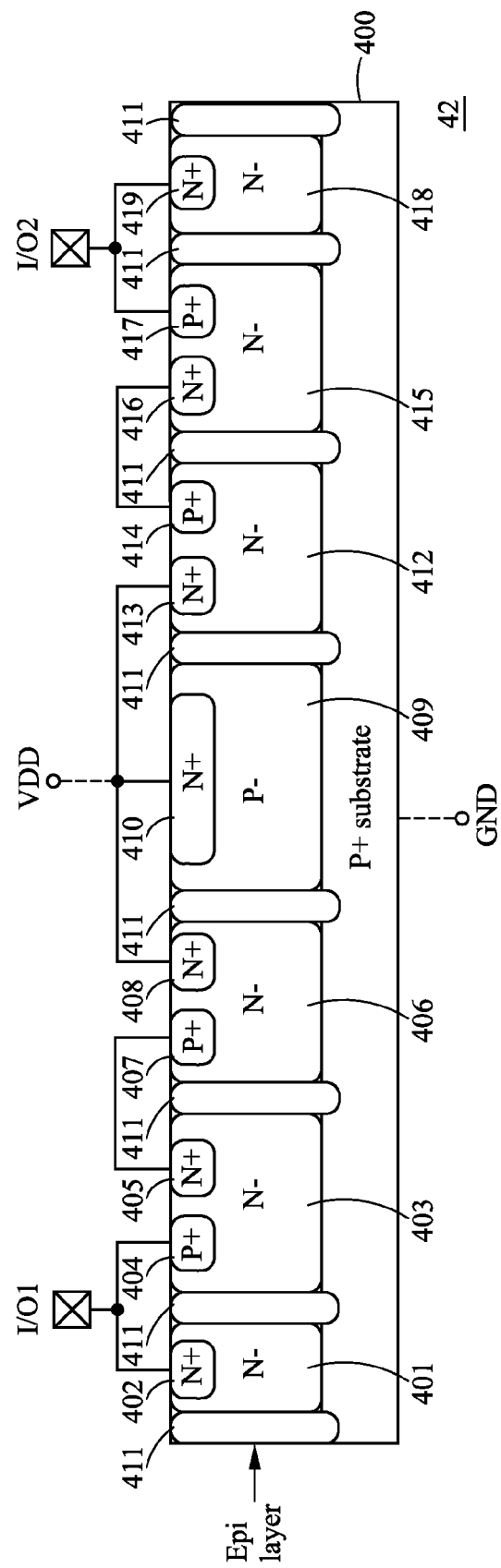
FIG. 4C is a cross-sectional view showing a bi-directional TVS 42 for ESD protection according to one embodiment of the present invention.

FIG. 4C is a cross-sectional view showing a TVS 42 for bi-directional ESD protection according to one embodiment of the present invention. The TVS 42 includes: a conductivity type substrate 400 having highly doping concentration; a first type lightly doped region 401, having a first type heavily doped region 402 arranged therein, wherein the first type lightly doped region 401 and the conductivity type substrate 400 respectively belong to opposite types, and wherein the first type heavily doped region 402 and the first type lightly doped region 401 belong to same types; a second type lightly doped region 403, having a second type heavily doped region 404 and a third type heavily doped region 405 arranged therein, wherein the second type lightly doped region 403 and the conductivity type substrate 400 respectively belong to opposite types, and wherein the second type heavily doped region 404 and the third type heavily doped region 405 respectively belong to opposite types, and the second type heavily doped region 404 and the conductivity type substrate 400 belong to same types, and wherein the second type heavily doped region 404 is connected with the first type heavily doped region 402, and wherein a first transistor Q1 is formed by the second type heavily doped region 404, the second type lightly doped region 403 and the conductivity type substrate 400; a third type lightly doped region 406, having a fourth type heavily doped region 407 and a fifth type heavily doped region 408 arranged therein, wherein the third type lightly doped region 406 and the conductivity type substrate 400 respectively belong to opposite types, and wherein the fourth type heavily doped region 407 and the fifth type heavily doped region 408 respectively belong to opposite types, and the fourth type heavily doped region 407 and the conductivity type substrate 400 belong to same types, and wherein the fourth type heavily doped region 407 is connected with the third type heavily doped region 405; a fourth type lightly doped region 409, having a sixth type heavily doped region 410 arranged therein, wherein the fourth type lightly doped region 409 and the conductivity type substrate 400 belong to same types; and wherein the fourth type lightly doped region 409 and the sixth type heavily doped region 410 respectively belong to opposite types, and wherein the sixth type heavily doped region 410 is connected with the fifth type heavily doped region 408; a fifth type lightly doped region 412, having a seventh type heavily doped region 413 and a eighth type heavily doped region 414 arranged therein, wherein the fifth type lightly doped region 412 and the conductivity type substrate 400 respectively belong to opposite types, and wherein the seventh type heavily doped region 413 and the eighth type heavily doped region 414 respectively belong to opposite types, and the eighth type heavily doped region 414 and the conductivity type substrate 400 belong to same types, and wherein the seventh type heavily doped region 413 is connected with the sixth type heavily doped region 410; a sixth type lightly doped region 415, having a ninth type heavily doped region 416 and a tenth type heavily doped region 417 arranged therein, wherein the sixth type lightly doped region 415 and the conductivity type substrate 400 respectively belong to opposite types, and wherein the ninth type heavily doped region 416 and the tenth type heavily doped region 417 respectively belong to opposite types, and the tenth type heavily doped region 417 and the conductivity type substrate 400 belong to same types, and wherein the ninth type heavily doped region 416 is connected with the eighth type heavily doped region 414, and wherein a second transistor Q2 is formed by the tenth type heavily doped region 417, the sixth type lightly doped region 415, and the conductivity type substrate 400; and a seventh type lightly doped region 418, having an eleventh type heavily doped region 419 arrange therein, wherein the seventh type lightly doped region 418 and the conductivity type substrate 400 respectively belong to opposite types, and wherein the eleventh type heavily doped region 419 and the seventh type lightly doped region 418 belong to same types, and wherein the eleventh type heavily doped region 419 is connected with the tenth type heavily doped region 417; a plurality of closed isolation trenches 411, arranged on the conductivity type substrate 400, wherein at least one of the plurality of closed isolation trenches is neighbored one of the type lightly doped regions; a first pin, connected with the first type heavily doped region 402 and the second type heavily doped region 404; and a third pin, connected with the tenth type heavily doped region 417 and the eleventh type heavily doped region 419. Additionally, the first type lightly doped region 401, the second type lightly doped region 403, the third type lightly doped region 406, the fourth type lightly doped region 409, the fifth type lightly doped region 412, the sixth type lightly doped region 415, the seventh type lightly doped region 418 and the plurality of closed isolation trenches 411 are arranged in the Epi layer on the conductivity type substrate 400.

Figure 4D:
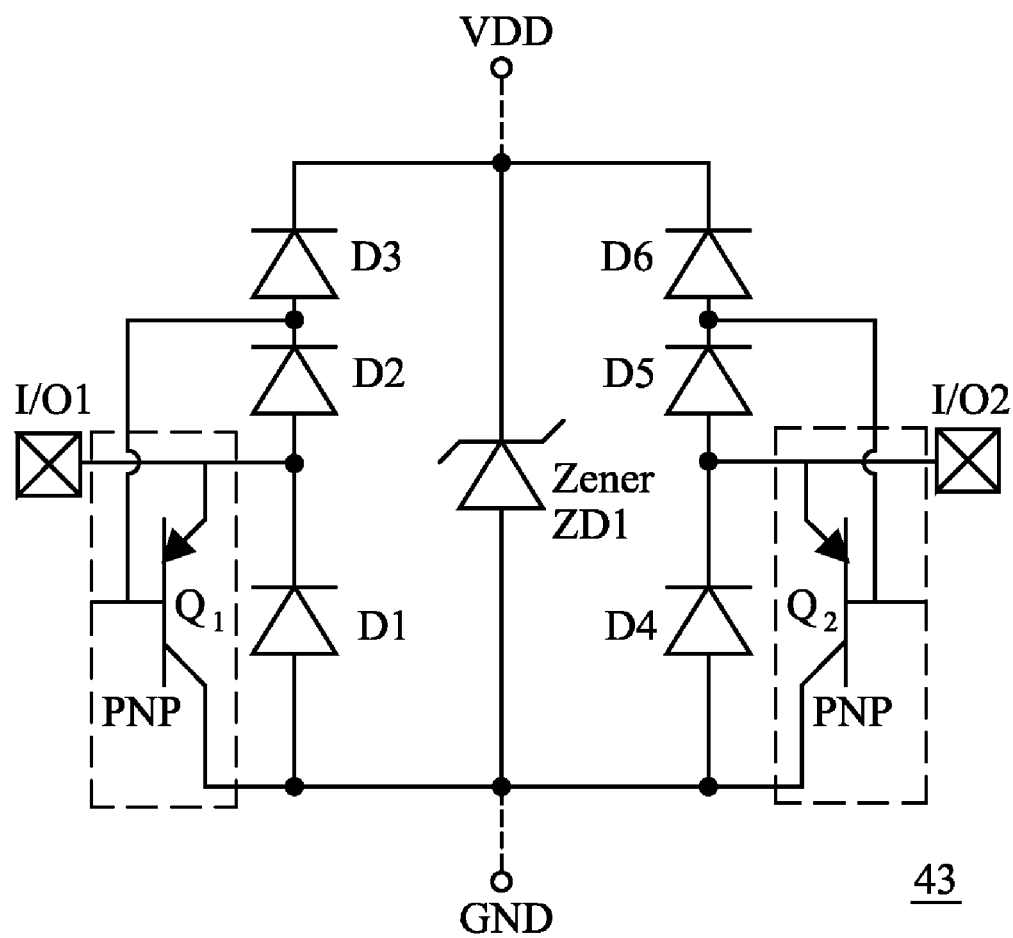
FIG. 4D is a schematic diagram showing an equivalent circuit 43 of FIG. 4C.

FIG. 4D is a schematic diagram showing an equivalent circuit 43 of FIG. 4C. The equivalent circuit 43 includes a first group of three diodes (D1, D2, D3) connected in serial connection, a second group of three diodes (D4, D5, D6) connected in serial connection, a zener diode ZD1 connected with the groups of diodes in parallel connection, a first pin and a third pin respectively connected to the first and second groups of three diodes. A first diode D1 is formed by the first type heavily doped region 402, the first type lightly doped region 401 and the conductivity type substrate 400, and a second diode D2 is formed by the second type heavily doped region 404, the second type lightly doped region 403 and the third type heavily doped region 405, and a third diode D3 is formed by the fourth type heavily doped region 407, the third type lightly doped region 406 and the fifth type heavily doped region 408, a fourth diode D4 is formed by the eleventh type heavily doped region 419, the seventh type lightly doped region 418 and the conductivity type substrate 400, and a fifth diode D5 is formed by the tenth type heavily doped region 417, the sixth type lightly doped region 415 and the ninth type heavily doped region 416, and a sixth diode D6 is formed by the eighth type heavily doped region 414, the fifth type lightly doped region 412 and the seventh type heavily doped region 413, and a zener diode ZD1 is formed by the sixth type heavily doped region 410, the fourth type lightly doped region 409 and the conductivity type substrate 400. In the present invention, the third and sixth diodes (D3 and D6) respectively are connected to the second and fifth diodes (D2 and D5) in series in order to reduce the input capacitance of TVS.

In one embodiment, the conductivity P type substrate 400 has highly doping concentration. The first N type lightly doped region 401 has the first N type heavily doped region 402 arranged therein. The second N type lightly doped region 403 has the second P type heavily doped region 404 and the third N type heavily doped region 405 arranged therein and the first PNP BJT Q1 is formed by the second P type heavily doped region 404, the second N type lightly doped region 403 and the conductivity P type substrate 400. The third N type lightly doped region 406 has the fourth P type heavily doped region 407 and the fifth N type heavily doped region 408 arranged therein. The fourth P type lightly doped region 409 has the sixth N type heavily doped region 410 arranged therein. The fifth N type lightly doped region 412 has the seventh N type heavily doped region 413 and the eighth P type heavily doped region 414 arranged therein. The sixth N type lightly doped region 415 has a ninth N type heavily doped region 416 and a tenth P type heavily doped region 417 arranged therein and the second PNP BJT Q2 is formed by the tenth P type heavily doped region 417, the sixth N type lightly doped region 415, and the conductivity P type substrate 400. The seventh N type lightly doped region 418, having an eleventh N type heavily doped region 419 arrange therein. The plurality of closed isolation trenches 411 are arranged on the conductivity P type substrate 400. The first pin is connected with the first N type heavily doped region 402 and the second P type heavily doped region 404 and the third pin is connected with the tenth P type heavily doped region 417 and the eleventh N type heavily doped region 419. In the embodiment, two ESD discharging paths are generated when the first pin connected with port I/O 1 is under positive ESD stress and the third pin connected with port I/O 2 is connected to the ground. One path is discharged through the lateral diodes (D2 and D3) to the zener diode (ZD1), and then discharged through the vertical diode (D4) to the ground (I/O 2). Another path is discharged through the parasitic PNP BJT (Q1), and then discharged through the vertical diode (D4) to the ground (I/O 2). Similarly, two ESD discharging paths are also generated when the first pin connected with port I/O 1 is under negative ESD stress and the third pin connected port I/O 2 is connected to the ground. Thereby, by adding extra ESD discharging path (for example, the discharging path through the parasitic PNP BJT), the ESD protection efficiency of TVS can be improved within the limited layout area.

According to another embodiment, the conductivity N type substrate 400 has highly doping concentration. The first P type lightly doped region 401 has the first P type heavily doped region 402 arranged therein. The second P type lightly doped region 403 has the second N type heavily doped region 404 and the third P type heavily doped region 405 arranged therein and the first NPN BJT Q1 is formed by the second N type heavily doped region 404, the second P type lightly doped region 403 and the conductivity N type substrate 400. The third P type lightly doped region 406 has the fourth N type heavily doped region 407 and the fifth P type heavily doped region 408 arranged therein. The fourth N type lightly doped region 409 has the sixth P type heavily doped region 410 arranged therein. The fifth P type lightly doped region 412 has the seventh P type heavily doped region 413 and the eighth N type heavily doped region 414 arranged therein. The sixth P type lightly doped region 415 has a ninth P type heavily doped region 416 and a tenth N type heavily doped region 417 arranged therein and the second NPN BJT Q2 is formed by the tenth N type heavily doped region 417, the sixth P type lightly doped region 415, and the conductivity N type substrate 400. The seventh P type lightly doped region 418, having an eleventh P type heavily doped region 419 arrange therein. The plurality of closed isolation trenches 411 are arranged on the conductivity N type substrate 400. The first pin is connected with the first P type heavily doped region 402 and the second N type heavily doped region 404 and the third pin is connected with the tenth N type heavily doped region 417 and the eleventh P type heavily doped region 419. In the embodiment, two ESD discharging paths are generated when the first pin connected with port I/O 1 is under positive ESD stress and the third pin connected port I/O 2 is connected to the ground. Similarly, two ESD discharging paths are also generated when the first pin connected with port I/O 1 is under negative ESD stress and the third pin connected with port I/O 2 is connected to the ground. Thereby, by adding extra discharging path (for example, the discharging path through the parasitic NPN BJT), the ESD protection efficiency of TVS can be improved within the limited layout area.

According to other embodiments of the present invention, the zener diode ZD1 shown in the FIG. 3B may be replace with a third transistor (not shown in), and the third transistor may be a PNP BJT or NPN BJT in accordance with the actual requirement and design. Moreover, the skilled person in the art should understand that the circuit operation and semiconductor structure in the embodiment with the third transistor is similar to the embodiment of FIGS. 3A-3D, and it will not be discussed herein.

Although the embodiments mentioned have been shown and described with respect to uni-directional/bi-directional TVS, equivalent alterations and modifications (for example, the uni-directional TVS with multi-channels and the bi-directional TVS with multi-channels) will occur to others skilled in the art based upon a reading an understanding of this embodiment and the annexed drawings.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A transient voltage suppressor for directional ESD protection, comprising:
    a conductivity type substrate having highly doping concentration;
    a first type lightly doped region, having a first type heavily doped region arranged therein, wherein the first type lightly doped region and the conductivity type substrate respectively belong to opposite types, and wherein the first type heavily doped region and the first type lightly doped region belong to same types;
    a second type lightly doped region, having a second type heavily doped region and a third type heavily doped region arranged therein, wherein the second type lightly doped region and the conductivity type substrate respectively belong to opposite types, and wherein the second type heavily doped region and the third type heavily doped region respectively belong to opposite types, and the second type heavily doped region and the conductivity type substrate belong to same types, and wherein the second type heavily doped region is connected with the first type heavily doped region, and wherein a first transistor is formed by the second type heavily doped region, the second type lightly doped region and the conductivity type substrate;
    a third type lightly doped region, having a fourth type heavily doped region and a fifth type heavily doped region arranged therein, wherein the third type lightly doped region and the conductivity type substrate respectively belong to opposite types, and wherein the fourth type heavily doped region and the fifth type heavily doped region respectively belong to opposite types, and the fourth type heavily doped region and the conductivity type substrate belong to same types, and wherein the fourth type heavily doped region is connected with the third type heavily doped region;
    a fourth type lightly doped region, having a sixth type heavily doped region arranged therein, wherein the fourth type lightly doped region and the conductivity type substrate belong to same types; and wherein the fourth type lightly doped region and the sixth type heavily doped region respectively belong to opposite types, and wherein the sixth type heavily doped region is connected with the fifth type heavily doped region;
    a plurality of closed isolation trenches, arranged on the conductivity type substrate, wherein at least one of the plurality of closed isolation trenches is neighbored one of the type lightly doped regions; and
    a first pin, connected with the first type heavily doped region and the second type heavily doped region.

2. The transient voltage suppressor according to claim 1, wherein a first diode is formed by the first type heavily doped region, the first type lightly doped region and the conductivity type substrate, and a second diode is formed by the second type heavily doped region, the second type lightly doped region and the third type heavily doped region, and a third diode is formed by the fourth type heavily doped region, the third type lightly doped region and the fifth type heavily doped region, and a zener diode is formed by the sixth type heavily doped region, the fourth type lightly doped region and the conductivity type substrate.

3. The transient voltage suppressor according to claim 1, wherein the first, third and fifth and sixth type heavily doped regions and the first, second and third type lightly doped regions are N type, and the second and fourth type heavily doped regions and the fourth type lightly doped region and the conductivity type substrate are P type.

4. The transient voltage suppressor according to claim 1, wherein a second pin is connected with the conductivity type substrate.

5. The transient voltage suppressor according to claim 1, wherein the first, third and fifth and sixth type heavily doped regions and the first, second and third type lightly doped regions are N type, and the second and fourth type heavily doped regions and the fourth type lightly doped region and the conductivity type substrate are P type.

6. The transient voltage suppressor according to claim 1, further comprising:
    a fifth type lightly doped region, having a seventh type heavily doped region and a eighth type heavily doped region arranged therein, wherein the fifth type lightly doped region and the conductivity type substrate respectively belong to opposite types, and wherein the seventh type heavily doped region and the eighth type heavily doped region respectively belong to opposite types, and the eighth type heavily doped region and the conductivity type substrate belong to same types, and wherein the seventh type heavily doped region is connected with the sixth type heavily doped region;
    a sixth type lightly doped region, having a ninth type heavily doped region and a tenth type heavily doped region arranged therein, wherein the sixth type lightly doped region and the conductivity type substrate respectively belong to opposite types, and wherein the ninth type heavily doped region and the tenth type heavily doped region respectively belong to opposite types, and the tenth type heavily doped region and the conductivity type substrate belong to same types, and wherein the ninth type heavily doped region is connected with the eighth type heavily doped region, and wherein a second transistor is formed by the tenth type heavily doped region, the sixth type lightly doped region, and the conductivity type substrate;
    a seventh type lightly doped region, having an eleventh type heavily doped region arrange therein, wherein the seventh type lightly doped region and the conductivity type substrate respectively belong to opposite types, and wherein the eleventh type heavily doped region and the seventh type lightly doped region belong to same types, and wherein the eleventh type heavily doped region is connected with the tenth type heavily doped region; and a third pin, connected with the tenth type heavily doped region and the eleventh type heavily doped region.

7. The transient voltage suppressor according to claim 6, wherein a fourth diode is formed by the eleventh type heavily doped region, the seventh type lightly doped region and the conductivity type substrate, and a fifth diode is formed by the tenth type heavily doped region, the sixth type lightly doped region and the ninth type heavily doped region, and a sixth diode is formed by the eighth type heavily doped region, the fifth type lightly doped region and the seventh type heavily doped region.

8. The transient voltage suppressor according to claim 6, wherein a seventh, ninth and eleventh type heavily doped regions and the fifth, sixth and seventh type lightly doped region are N type, and the eighth and tenth type heavily doped regions are P type.

9. The transient voltage suppressor according to claim 6, wherein a seventh, ninth and eleventh type heavily doped regions and the fifth, sixth and seventh type lightly doped region are P type, and the eighth and tenth type heavily doped regions are N type.

\* \* \* \* \*